United States Patent [19]

Ohoka

[11] Patent Number: 5,356,827
[45] Date of Patent: Oct. 18, 1994

[54] METHOD OF MANUFACTURING SEMICONDUCTOR DEVICE

[75] Inventor: Tsukasa Ohoka, Tokyo, Japan

[73] Assignee: NEC Corporation, Japan

[21] Appl. No.: 30,658

[22] Filed: Mar. 12, 1993

[30] Foreign Application Priority Data

Mar. 19, 1992 [JP] Japan .................................. 4-62903

[51] Int. Cl.$^5$ ........................................... H01L 21/76
[52] U.S. Cl. ...................................... 437/63; 437/62; 437/67; 437/974; 148/DIG. 12
[58] Field of Search ...................... 437/62, 63, 974, 67; 148/DIG. 12

[56] References Cited

U.S. PATENT DOCUMENTS

| | | | |
|---|---|---|---|
| 4,784,970 | 11/1988 | Solomon | 437/974 |
| 4,948,748 | 8/1990 | Kitamara et al. | 437/62 |
| 4,963,505 | 10/1990 | Fujii et al. | 148/DIG. 12 |
| 5,097,314 | 3/1992 | Nakagawa et al. | 437/974 |
| 5,164,218 | 11/1992 | Tsuruta et al. | 148/DIG. 12 |

OTHER PUBLICATIONS

Akio Nakagawa, et al., "High Voltage, New Driver IC Technique Based on Silicon Wafer Direct-Bonding (SDB)" PESC '88 Record, Apr. 1988, pp. 1325-1329.

Primary Examiner—Tom Thomas
Assistant Examiner—Trung Quoc Dang
Attorney, Agent, or Firm—Laff, Whitesel, Conte & Saret

[57] ABSTRACT

A method of manufacturing a semiconductor device includes the following steps. A wide groove portion is formed in a predetermined portion of one major surface of a first semiconductor substrate. A first insulating film is formed on the bottom surface of the groove portion. The major surface of the first semiconductor substrate except for the first insulating film is polished to form a mirror-polished surface on the same level as the surface of the first insulating film. One major surface of a second semiconductor substrate is bonded to the mirror-polished surface of the first semiconductor substrate and the surface of the first insulating film by direct bonding, and the resultant structure is heat-treated, thereby forming a composite semiconductor substrate. A groove having a ring-like planar shape is formed to extend from the other major surface of the first semiconductor substrate constituting the composite semiconductor substrate to the first insulating film. A second insulating film is formed on the side walls of the ring-like groove. An island-like element formation region insulated/isolated from the remaining region by the first and second insulating films is formed on the first semiconductor substrate.

10 Claims, 3 Drawing Sheets

METHOD OF MANUFACTURING SEMICONDUCTOR DEVICE

BACKGROUND OF THE INVENTION

The present invention relates to a method of manufacturing a semiconductor device and, more particularly, to a method of manufacturing a composite semiconductor substrate having high-voltage elements isolated from each other.

In a conventional composite semiconductor device having a large-current power element with a high breakdown voltage and a control circuit element integrated into a monolithic structure, in order to improve the current efficiency, the power element, e.g., a power MOSFET is designed such that a source electrode and a gate electrode are formed on the same substrate surface as the control circuit element, and a drain electrode is formed on the opposite surface (lower surface) of the substrate. Therefore, this device requires a structure for electrically isolating the power element and the control circuit element from each other.

A p-n junction isolation technique is generally employed as a technique of isolating such elements. More specifically, a p-type epitaxial layer is formed on an n-type semiconductor substrate, and an n-type epitaxial layer is further formed on the resultant structure. A p-type impurity layer is then formed by diffusion to extend from the surface of the n-type epitaxial layer to the p-type epitaxial layer through the n-type epitaxial layer. As a result, the control circuit element region is surrounded by these p-type layers, and the resultant p-n junction is reverse-biased, thereby electrically isolating the power element and the control circuit element from each other.

As an insulation/isolation method using an SOI substrate, a technique shown in FIGS. 4A and 4B is disclosed in IEEE PESC (Power Electronics Specialist Conference), '88 RECORD No. 7 C-5 (April, 1988). In this technique, as shown in FIG. 4A, first and second silicon substrates 59 and 60 are bonded to each other through a silicon dioxide film 55, and an insulating isolation groove 61 is formed by depositing a silicon dioxide film 57 on the side walls of a V- groove formed in the first silicon substrate 59 and filling the groove with polycrystalline silicon 58. A control circuit element region 52 surrounded by the insulating isolation groove 61 and having a heavily doped layer 54 is formed on the first silicon substrate 59. A portion 53 adjacent to the region 52 on the first silicon substrate 59 is removed by etching. Subsequently, as shown in FIG. 4B, a silicon layer is epitaxially grown on the portion, of the substrate 59, from which the portion 53 is removed by etching, and a power MOSFET is formed in this epitaxial growth layer 56. A drain electrode (not shown) of this transistor is formed on the lower surface of the second silicon substrate 60.

When a power element having a current path, formed to extend from the upper surface to the lower surface of a silicon substrate, and a control circuit element are to be integrated into a monolithic structure, a high breakdown voltage is very difficult to obtain by element isolation based on a p-n junction. In addition, according to the conventional isolation technique using the above-described SOI substrate, although a high breakdown voltage can be obtained, a complicated manufacturing process is required, and an increase in cost cannot be avoided because a power element region is formed by epitaxial grown after the formation of a control circuit element.

SUMMARY OF THE INVENTION

It is an object of the present invention to provide a method of manufacturing a semiconductor device, which can obtain a high breakdown voltage when a power element and a control circuit element are integrated into a monolithic structure.

It is another object of the present invention to provide a method of manufacturing a semiconductor device, which facilitates the manufacture of a composite semiconductor substrate having an insulation/isolation structure at low cost.

In order to achieve the above objects, according to the present invention, there is provided a method of manufacturing a semiconductor device, comprising the steps of forming a wide groove portion in a predetermined portion of one major surface of a first semiconductor substrate, forming a first insulating film on a bottom surface of the groove portion, polishing the major surface of the first semiconductor substrate except for the first insulating film to form a mirror-polished surface on the same level as a surface of the first insulating film, and bonding one major surface of a second semiconductor substrate to the mirror-polished surface of the first semiconductor substrate and the surface of the first insulating film by direct bonding and heat-treating the resultant structure, thereby forming a composite semiconductor substrate.

DESCRIPTION OF THE PREFERRED EMBODIMENT

The present invention will be described below with reference to the accompanying drawings. FIGS. 1A to 1E show the steps in a method of manufacturing a semiconductor device according to an embodiment of the present invention.

Figure 1A:
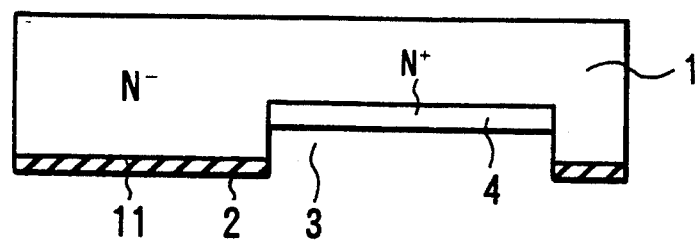
FIGS. 1A to 1E are sectional views showing a method of manufacturing a semiconductor device according to an embodiment of the present invention.

As shown in FIG. 1A, a silicon dioxide film 2 serving as a mask member is formed on one major surface 11 of an n⁻-type first silicon substrate 1. A predetermined portion of the major surface 11 is then selectively exposed, and etching is performed by an anisotropic reactive ion etching (RIE) method using the silicon dioxide film 2 as a mask, thus forming a wide groove portion 3 in the predetermined exposed portion. The groove portion 3 is formed to be slightly larger than an element formation region to be described later. Subsequently, an n⁺-type buried layer 4 having an impurity concentration higher than that of the first silicon substrate 1 is formed on the bottom surface of the groove portion 3. This buried layer 4 is a buffer layer for a circuit element formation region and need not always be formed.

Figure 1B:
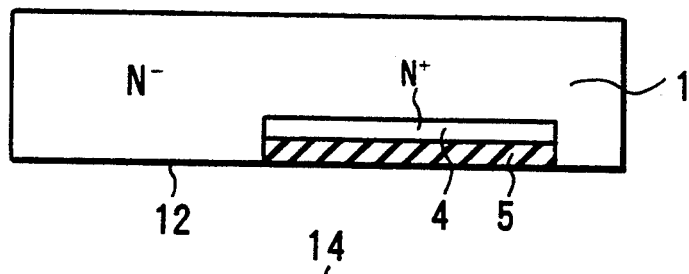

As shown in FIG. 1B, the first silicon substrate 1 is thermally oxidized to form a silicon dioxide film 5 on the bottom surface of the groove portion 3. This silicon dioxide film 5 can also be formed by the CVD method. Thereafter, the major surface 11 of the first silicon substrate 1 except for the predetermined portion, in which the groove portion 3 is formed, is polished to obtain a flat mirror-polished surface 12 on the same level as the flat surface of the silicon dioxide film 5 formed on the bottom surface of the groove portion 3.

Figure 1C:
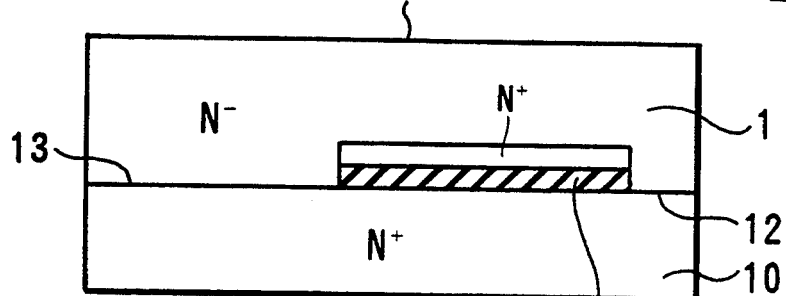

As shown in FIG. 1C, one major surface 13 of an $n^+$-type second silicon substrate 10 having an impurity concentration higher than that of the first silicon substrate 1 is bonded to the mirror-polished surface 12 of the first silicon substrate 1 and the surface of the silicon dioxide film 5 by direct bonding. The resultant structure is then subjected to heat treatment to bond silicon atoms together at the interface between the mirror-polished surface 12 of the first silicon substrate 1 and the major surface 13 of the second silicon substrate 10. The opposite major surface of the first silicon substrate 1 is then polished to form a new major surface 14, and the first silicon substrate 1 has a predetermined thickness. As a result, an SOI substrate is constituted by the first and second silicon substrates 1 and 10.

Figure 1D:
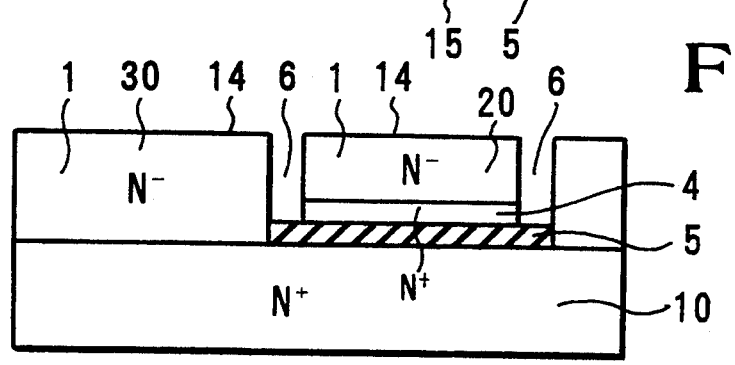

As shown in FIG. 1D, an isolation groove 6 having a rectangular cross-section is formed to extend from the major surface 14 of the first silicon substrate 1 of the composite semiconductor substrate to the silicon dioxide film 5. This isolation groove 6 has a ring-like planar shape, e.g., a rectangular ring-like shape, and surrounds an element formation region 20 on the first silicon substrate 1. Therefore, the above-mentioned groove portion 3 is formed to be larger than the circuit element formation region 20 by the width of the isolation groove 6.

Figure 1E:
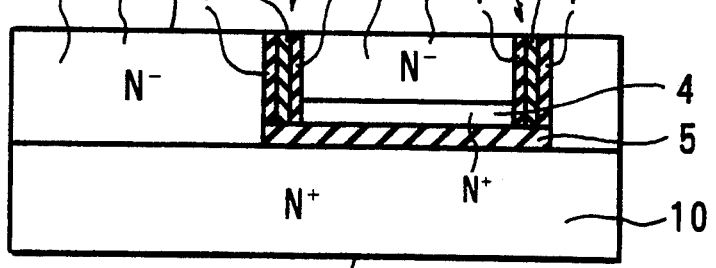

As shown in FIG. 1E, the substrate is thermally oxidized to form a silicon dioxide film 7 on the side walls of the ring-like isolation groove 6 on both sides. The groove 6 is then filled with polycrystalline silicon 8. With this process, the circuit element formation region 20 is formed from the first silicon substrate 1, which region is insulated/isolated from a remaining region 30 of the first silicon substrate 1 through the silicon dioxide film 7 on the side walls of the ring-like isolation groove 6 and the silicon dioxide film 5 formed on the bottom surface of the groove portion 3. Thereafter, the major surface 14 of the first silicon substrate 1 is mirror-polished to form a mirror-polished surface 15. As a result, an SOI substrate having the upper surface 15, which is the mirror-polished surface of the first silicon substrate 1, and a lower surface 16, which is the other major surface of the second silicon substrate 10, can be obtained.

Figure 2:
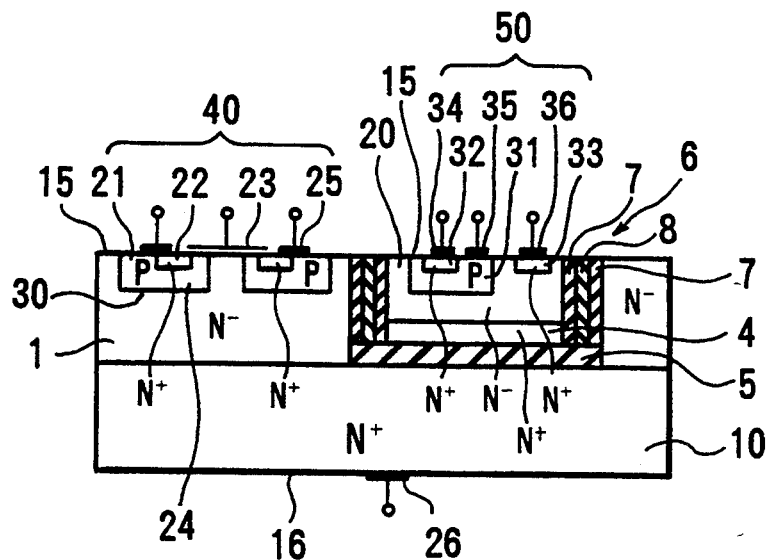
FIG. 2 is a sectional view showing the method of manufacturing the semiconductor device according to the embodiment of the present invention.

A predetermined element formation process is performed with respect to the SOI substrate shown in FIG. 1E to form the semiconductor integrated circuit device shown in FIG. 2. Referring to FIG. 1, a power element 40 is formed in the region 30, of the first silicon substrate 1, which is located outside the ring-like isolation groove 6 and is electrically connected to the second silicon substrate 10. An electrode 26 as part of the power element 40 is formed on the other major surface of the second silicon substrate 10, i.e., the lower surface 16 of the composite SOI substrate. Meanwhile, a control circuit element 50 is formed on the island-like circuit element formation region 20 which is surrounded by the isolation groove 6 and is insulated/isolated from the second silicon substrate 10 and the region 30 of the first silicon substrate 1.

In the embodiment shown in FIG. 2, the power element 40 is a vertical power MOSFET, which is designed such that a p-type base region 21 and an $n^+$-type source region 22 are formed from the upper surface 15 of the $n^-$-type substrate region 30 serving as a drain region of the first silicon substrate 1, and a common electrode 25 for the two regions 21 and 22 is formed on the upper surface 15. A gate electrode 23 is formed on a channel formation region 24 in the base region 21 through a gate insulating film (not shown). The drain electrode 26 is formed on the lower surface 16 of the $n^+$-type silicon substrate 10. The base region 21, the source region 22, the channel formation region 24, and the common electrode 25 respectively have ring-like planar shapes. The control circuit element 50 formed in the island-like circuit element formation region 20 is a bipolar transistor, which is designed such that a p-type base region 31, an $n^+$-type emitter region 32, and an $n^+$-type collector contact region 33 are formed from the upper surface 15 of the $n^-$-type substrate region of the first silicon substrate 1, and a base electrode 35, an emitter electrode 34, and a collector electrode 36 are connected to the respective regions.

This bipolar transistor 50 as the control circuit element is insulated by the silicon dioxide films 5 and 7 serving as insulating films from a drain electrical potential applied to the electrode 26. Owing to these insulating films 5 and 7, therefore, a high breakdown voltage can be obtained.

Figure 3:
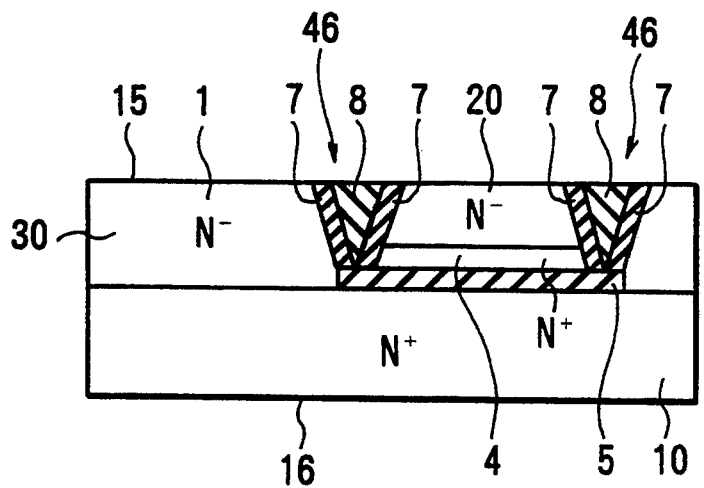
FIG. 3 is a sectional view showing a method of manufacturing a semiconductor device according to another embodiment of the present invention.
Figure 4A:
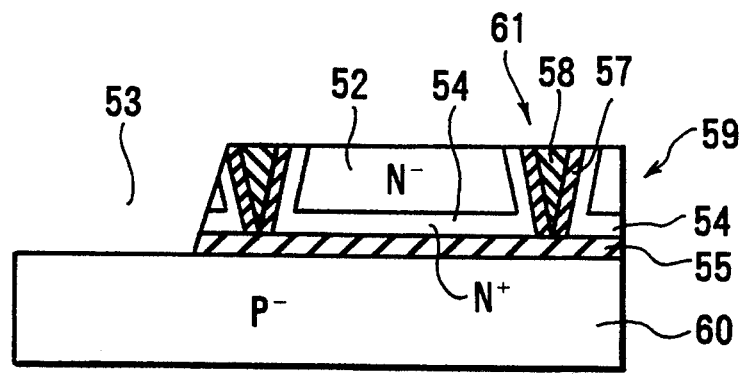
FIGS. 4A and 4B are sectional views showing a conventional method of manufacturing a semiconductor device.
Figure 4B:
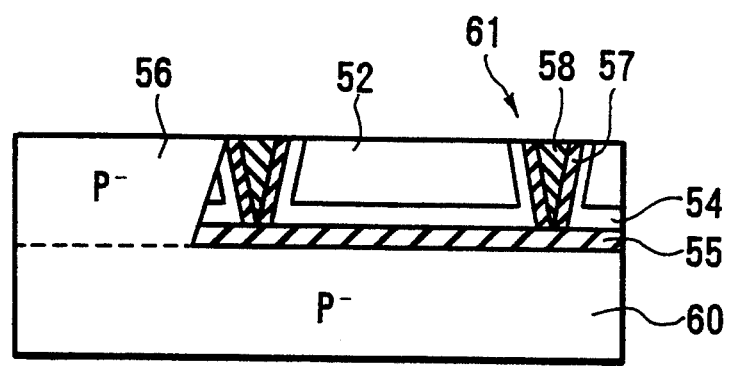

FIG. 3 shows an SOI substrate having an insulation-/isolation structure according to another embodiment of the present invention. The same reference numerals in FIG. 3 denote the same parts as in FIGS. 1A to 1E. In this embodiment, since an isolation groove 46 is formed by an isotropic etching method using an alkali aqueous solution, the isolation groove 46 has an inverted triangular cross-section, as shown in FIG. 3. Since the effects of this embodiment are the same as those of the previous embodiment, a description thereof will be omitted.

As has been described above, according to the present invention, the surface of the first semiconductor substrate and the surface of the insulating film are set on the same level, and the second semiconductor substrate is bonded to these surfaces, thereby easily manufacturing a composite semiconductor substrate which allows the formation of a power element having a current path extending from the upper surface to the lower surface of the substrate, and the insulation/isolation of the power element from the control circuit element.

What is claimed is:

1. A method of manufacturing a semiconductor device, comprising the steps of:
   forming a wide groove portion in a predetermined portion of one major surface of a first semiconductor substrate, the wide groove portion having a bottom surface formed to be flat;
   forming a first insulating film on the bottom surface of said groove portion;
   polishing the major surface of said first semiconductor substrate except for a surface of said first insulating film in said groove portion to form a mirror-polished surface on the same level as the surface of said first insulating film, said polishing of the major surface of said first semiconductor device and said first insulating film having a flat face with the same level; and bonding to cause an adherence between one major surface of a second semiconductor substrate and the flat face of said first semiconductor substrate and said first insulating film without gap by direct bonding and heat-treating the resultant structure, thereby forming a composite semiconductor substrate.

2. A method according to claim 1, further comprising the steps of forming a groove having a planar ring shape and extending from the other major surface of said first semiconductor substrate constituting said composite semiconductor substrate to said first insulating film, and forming a second insulating film on side walls of said ring shaped groove, so that an island element formation region insulated/isolated from a remaining region by said first and second insulating films is formed on said first semiconductor substrate.

3. A method according to claim 2, wherein a power element is formed in a region, of said first semiconductor substrate, which is located outside said ring shaped groove and electrically connected to said second semiconductor substrate, and a control circuit element is formed in said island element formation region.

4. A method according to claim 3, wherein said power element is a MOSFET, and said control circuit element is a bipolar transistor.

5. A method according to claim 2, wherein said groove portion is formed to be larger than said element formation region by a width of said ring shaped groove.

6. A method according to claim 1, wherein said first semiconductor substrate is a silicon substrate of one conductivity type, and said second semiconductor substrate is a silicon substrate of one conductivity type which has an impurity concentration higher than that of said first semiconductor substrate.

7. A method according to claim 1, further comprising the step of forming an impurity region of one conductivity type, which has an impurity concentration higher than that of said first semiconductor substrate, on the bottom surface of said groove portion before said first semiconductor substrate is formed.

8. A method according to claim 1, wherein said ring shaped groove has a rectangular cross-section.

9. A method according to claim 1, wherein said ring shaped groove has an inverted triangular cross-section.

10. A method of manufacturing a semiconductor device, comprising of the steps of:

forming a wide groove portion in a predetermined portion of one major surface of a first semiconductor substrate, the wide groove portion having a bottom surface formed to be flat;

forming a first insulating film on the bottom surface of said groove portion;

polishing only the major surface of said first semiconductor substrate except for a surface of said first insulating film in said groove portion to form a mirror-polished surface on the same level as the surface of said first insulating film, said polishing of the major surface of said first semiconductor device and said first insulating film having a flat face with the same level; and bonding to cause an adherence between one major surface of a second semiconductor substrate and the flat face of said first semiconductor substrate and said first insulating film without a structure for forming a composite semiconductor substrate; and forming a second insulating film having a ring shaped planar shape and extending from the other major surface of said first semiconductor substrate of said first insulating film in order to form an island element formation region insulated/isolated form a remain region on said first semiconductor substrate.

* * * * *